US008504337B2

(12) United States Patent
Foster et al.

(10) Patent No.: US 8,504,337 B2
(45) Date of Patent: Aug. 6, 2013

(54) METHOD AND SYSTEM FOR ANALYZING THREE-DIMENSIONAL LINKAGES

(75) Inventors: David Foster, Morton, IL (US); Rammagy Yoeu, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 884 days.

(21) Appl. No.: 12/007,964

(22) Filed: Jan. 17, 2008

(65) Prior Publication Data

US 2008/0183438 A1 Jul. 31, 2008

Related U.S. Application Data

(60) Provisional application No. 60/880,710, filed on Jan. 17, 2007.

(51) Int. Cl.
| | | |
|---|---|---|
| *G06G 7/48* | (2006.01) | |
| *G06T 15/00* | (2006.01) | |
| *G06T 17/00* | (2006.01) | |
| *G06F 17/00* | (2006.01) | |

(52) U.S. Cl.
USPC ........ 703/7; 703/6; 703/1; 345/419; 345/420; 700/97; 700/98

(58) Field of Classification Search
USPC ..................................... 703/1, 2, 7
See application file for complete search history.

(56) References Cited

U.S. PATENT DOCUMENTS

| | | | | |
|---|---|---|---|---|
| 4,858,146 A | * | 8/1989 | Shebini ............................. | 703/1 |
| 5,043,929 A | * | 8/1991 | Kramer et al. .................... | 703/1 |
| 5,253,189 A | * | 10/1993 | Kramer ............................. | 703/7 |
| 5,297,057 A | * | 3/1994 | Kramer et al. .................... | 703/7 |
| 5,452,238 A | * | 9/1995 | Kramer et al. .................... | 703/1 |
| 5,831,875 A | * | 11/1998 | Hirata et al. ...................... | 703/7 |
| 5,835,693 A | * | 11/1998 | Lynch et al. .................. | 345/473 |
| 5,859,786 A | * | 1/1999 | Klein ............................... | 703/2 |
| 6,219,049 B1 | * | 4/2001 | Zuffante et al. ............... | 715/764 |
| 6,366,293 B1 | * | 4/2002 | Hamilton et al. ............. | 345/649 |
| 6,675,155 B2 | * | 1/2004 | Sasagawa et al. .............. | 706/13 |
| 7,088,377 B2 | * | 8/2006 | Cook ............................ | 345/649 |
| 7,110,922 B2 | * | 9/2006 | Onodera et al. .................. | 703/2 |
| 7,257,521 B2 | * | 8/2007 | Hashima et al. .................. | 703/7 |
| 7,292,964 B1 | * | 11/2007 | Mukherjee et al. ............... | 703/1 |
| 7,313,504 B2 | * | 12/2007 | Chin et al. ........................ | 703/1 |
| 7,319,941 B1 | * | 1/2008 | Mukherjee et al. ............... | 703/1 |
| 7,363,197 B2 | * | 4/2008 | Onodera et al. .................. | 703/1 |

(Continued)

OTHER PUBLICATIONS

FEAP—A Finite Element Analysis Program; Version 7.3 User Manual; Robert L. Taylor; Dec. 2000; 417 Pgs.*

(Continued)

*Primary Examiner* — Akash Saxena
(74) *Attorney, Agent, or Firm* — Finnegan, Henderson, Farabow, Garrett & Dunner LLP

(57) ABSTRACT

A method for analyzing a mechanical system is disclosed. The method includes, using a computer program product, importing from an engineering design software program data related to a mechanical assembly. The method further includes, using the computer program product, selecting two or more points and one or more connections associated with the mechanical assembly. The method additionally includes based on the selected two or more points, the selected one or more connections, and the imported data, determining one or more three-dimensional model solutions. The method also includes presenting the one or more three-dimensional model solutions to a user, and selecting one of the presented three-dimensional model solutions.

17 Claims, 9 Drawing Sheets

U.S. PATENT DOCUMENTS

| | | | |
|---|---|---|---|
| 7,623,139 B1* | 11/2009 | Gifford et al. | 345/619 |
| 7,783,460 B1* | 8/2010 | Mukherjee et al. | 703/2 |
| 2001/0019333 A1* | 9/2001 | Sasaki | 345/653 |
| 2002/0089499 A1* | 7/2002 | Lee et al. | 345/419 |
| 2003/0071810 A1* | 4/2003 | Shoov et al. | 345/420 |
| 2003/0154451 A1* | 8/2003 | Rassaian | 716/4 |
| 2005/0171745 A1* | 8/2005 | Breitfeld et al. | 703/2 |
| 2005/0212797 A1* | 9/2005 | Lee et al. | 345/419 |
| 2007/0080961 A1* | 4/2007 | Inzinga et al. | 345/419 |
| 2007/0198230 A1* | 8/2007 | Wang et al. | 703/1 |
| 2008/0243456 A1* | 10/2008 | Hudetz et al. | 703/7 |
| 2008/0304935 A1* | 12/2008 | Scott et al. | 414/5 |
| 2009/0006039 A1* | 1/2009 | Watanabe | 703/1 |
| 2009/0012753 A1* | 1/2009 | Lionberg | 703/1 |
| 2010/0073366 A1* | 3/2010 | Tateno | 345/419 |
| 2010/0114349 A1* | 5/2010 | Lionberg | 700/97 |
| 2010/0153074 A1* | 6/2010 | Yanami et al. | 703/1 |
| 2011/0142354 A1* | 6/2011 | Sung et al. | 382/209 |

OTHER PUBLICATIONS

Parametric Technology Corporation, "Getting Started with Pro/Engineer, Wildfire 2.0," A Tutorial-based Guide to Workflow, Jun. 2004 (186 pgs.).

A Tutorial of Pro/Mechanica Motion, from http://www.me.uvic.ca/~mech410/Tut2001/ProMMotion.pdf, publication date unknown, printed on Aug. 26, 2008, 8 (pgs.).

\* cited by examiner

METHOD AND SYSTEM FOR ANALYZING THREE-DIMENSIONAL LINKAGES

This Application claims priority to U.S. Provisional Application No. 60/880,710, filed Jan. 17, 2007, and entitled "Method and System for Analyzing Three-Dimensional Linkages," incorporated herein in its entirety.

TECHNICAL FIELD

The present disclosure relates generally to data analysis mechanisms, and more particularly to a method and system for analyzing three-dimensional linkages in a mechanical system.

BACKGROUND

The present disclosure relates to a method, system, and computer program product for analyzing three-dimensional linkages. Existing computer software programs, such as Pro/Mechanica Motion™, MDX, and MDO provide users with the ability to design and analyze mechanical systems. However, these programs are cumbersome when used to analyze complex linkages, and may not integrate the most user-friendly graphical design and analysis features. The disclosed embodiments are directed to solving one or more of these problems.

SUMMARY

In one embodiment, a method for analyzing a mechanical system is disclosed. The method includes, using a computer program product, importing from an engineering design software program data related to a mechanical assembly. The method further includes, using the computer program product, selecting two or more points and one or more connections associated with the mechanical assembly. The method additionally includes based on the selected two or more points, the selected one or more connections, and the imported data, determining one or more three-dimensional model solutions. The method also includes presenting the one or more three-dimensional model solutions to a user, and selecting one of the presented three-dimensional model solutions.

In another embodiment a computer program product stored on a computer readable medium is disclosed. The computer program product includes instructions that when executed, instructing one or more processors to perform a method. The method includes importing, from an engineering design software program, data related to a mechanical assembly. The method further includes receiving a selection of two or more points and one or more connections associated with the mechanical assembly, and based on the selected two or more points, the selected one or more connections, and the imported data, determining one or more three-dimensional model solutions. The method additionally includes presenting the one or more three-dimensional model solutions to a user, and receiving a selection of a model from the presented three-dimensional model solutions.

In another embodiment, a method for creating a model of a three-dimensional mechanical system is disclosed. The method includes selecting, based on input by a user, two or more points and one or more connections associated with a mechanical assembly. The method further includes based on the selected two or more points, the selected one or more connections, and additional data associated with the mechanical assembly, determining by a computer program product one or more three-dimensional model solutions. The method additionally includes presenting the one or more three-dimensional model solutions to the user, and selecting, by the user, a model from the presented three-dimensional model solutions.

DETAILED DESCRIPTION

The disclosed embodiments include a method, system, and computer program product (hereinafter referred to as an "analysis package") for creating and/or analyzing models of mechanical systems. The computer program product may include, for example, instructions stored on a computer readable medium (e.g., CD-ROM, DVD-ROM, EEPROM, Flash Memory, hard drive, or other memory storage). The analysis package provides a number of graphical user interfaces ("GUIs") that permit data related to mechanical parts and linkages to be entered and/or selected for analysis. The analysis package further permits analysis of geometry, force, base stability, and other factors related to three-dimensional mechanical systems. In one embodiment, the analysis package may be integrated with engineering design software such as Pro/ENGINEER™, such that the analysis package may transfer data to and from the engineering design software and may use the transferred data for analyzing a mechanical system. Although Pro/ENGINEER software is described as one example, the analysis package of the disclosed embodiments may be integrated with one or more other similar engineering design software programs.

The analysis package includes a number of algorithms and modules that are used to implement one or more methods of the disclosed embodiments. The analysis package may be implemented using a personal computer, laptop, PDA, mainframe, or any other data processing device including memory and one or more processors configured to execute computer program instructions. In one embodiment, the analysis package may be implemented using more than one data processing device, such as a network of computers (e.g., the Internet).

Figure 1:
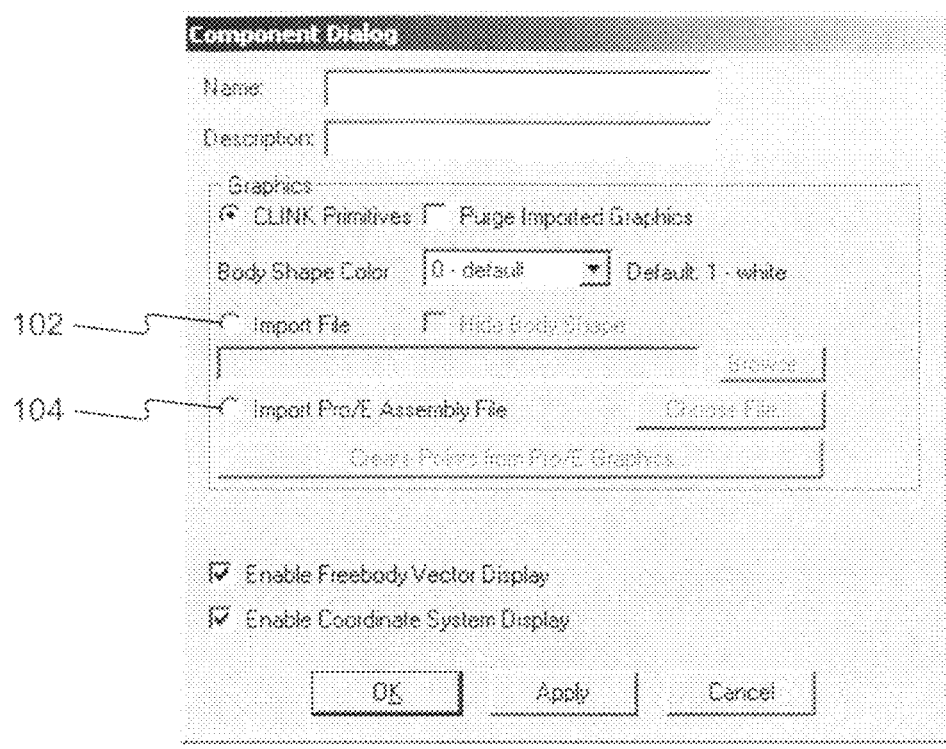
FIG. 1 illustrates a first exemplary graphical user interface ("GUI") consistent with certain disclosed embodiments.

In order to permit analysis of a mechanical system, the disclosed computer program product provides one or more GUIs for selecting the components, links, connection points, connection types, and other physical attributes of the mechanical system to be analyzed. For example, FIG. 1 illustrates an exemplary GUI that permits a user to select physical attributes of a mechanical system. In one embodiment, one or more portions of a mechanical system to be analyzed may be imported from an existing file, such as a Pro/ENGINEER ("Pro/E") file, by selecting a button such as "Import File" button 102 or "Import Pro/E Assembly File" button 104, and by using one or more application program interfaces (APIs). For example, one or more APIs may be used to export the physical attributes of a mechanical system stored in a Pro/E file into a raw data file, which can then be read by the analysis package.

Figure 2:
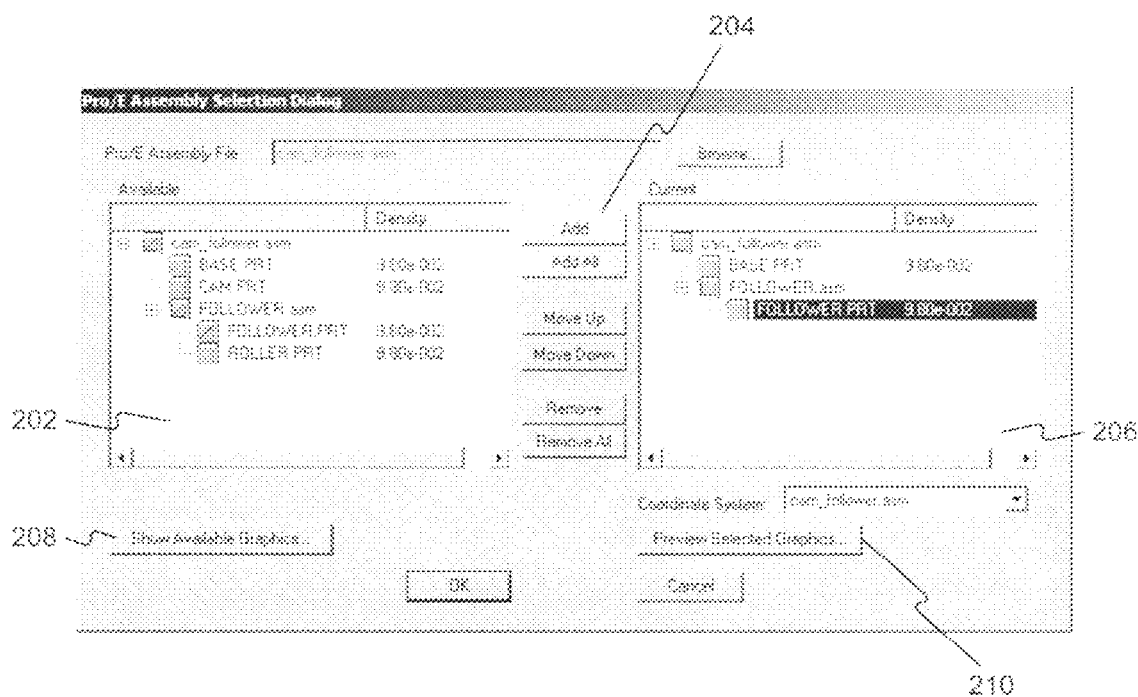
FIG. 2 illustrates a second exemplary GUI consistent with certain disclosed embodiments.

Using a dialog box such as depicted in FIG. 2, a user may select particular portions of a mechanical system to include in a model to be analyzed. For example, in one embodiment, the tree depicted in window 202 of FIG. 2 may indicate a machine assembly comprising a number of parts and/or sub-assemblies. A user may select particular parts and sub-assemblies within the machine assembly to include in an analysis model by, for example, selecting the part or sub-assembly in window 202 and clicking "add" button 204. Selected parts or subassemblies may be displayed, for example, in window 206. Other methods for selecting the parts and/or sub-assemblies may be used as well. The imported information associated with the mechanical system may include physical attributes such as dimensions, weight, mechanical connection points, shape, etc.

In one embodiment, a graphical representation of the parts and/or sub-assemblies available to be included in the model may be viewed by clicking an appropriate button (e.g., "Show Available Graphics" button 208). In a further embodiment, a graphical representation of the parts and/or sub-assemblies already selected for the model may also be viewed by clicking an appropriate button (e.g., "Preview Selected Graphics" button 210).

In addition to selecting parts and/or sub-assemblies for the model, a user may select additional information for analysis. For example, a user may select one or more points on a part or sub-assembly. In one embodiment, points may be selected based on point data (e.g., data indicating available connection points, data indicating high-stress points, etc.) imported from the Pro/E file.

Figure 3:
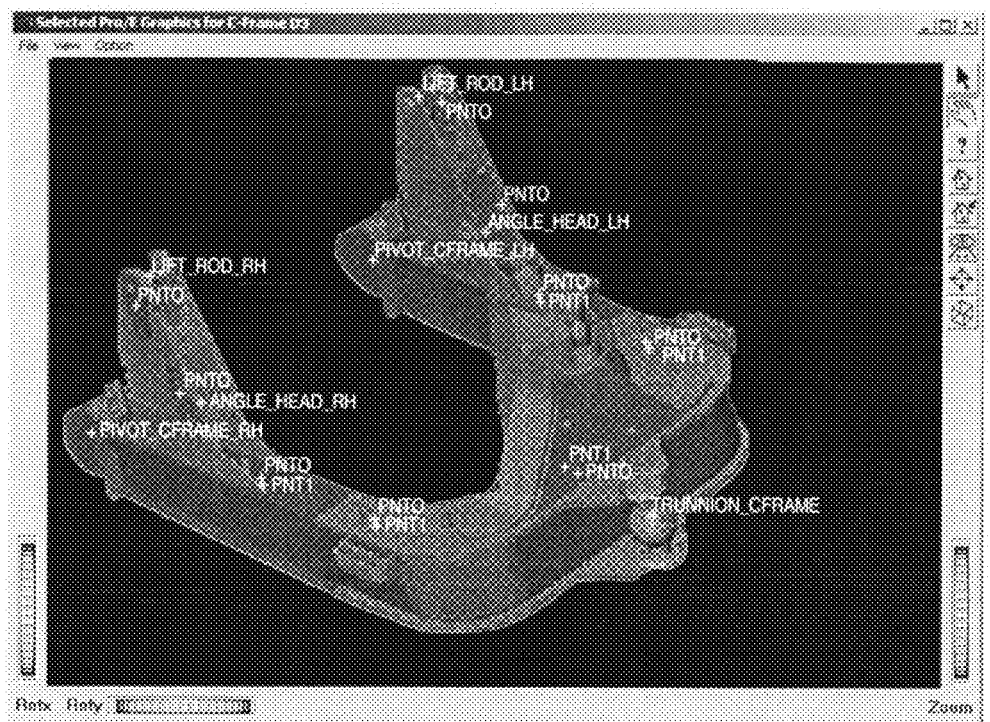
FIG. 3 illustrates an exemplary display and third exemplary GUI consistent with certain disclosed embodiments.
Figure 4:
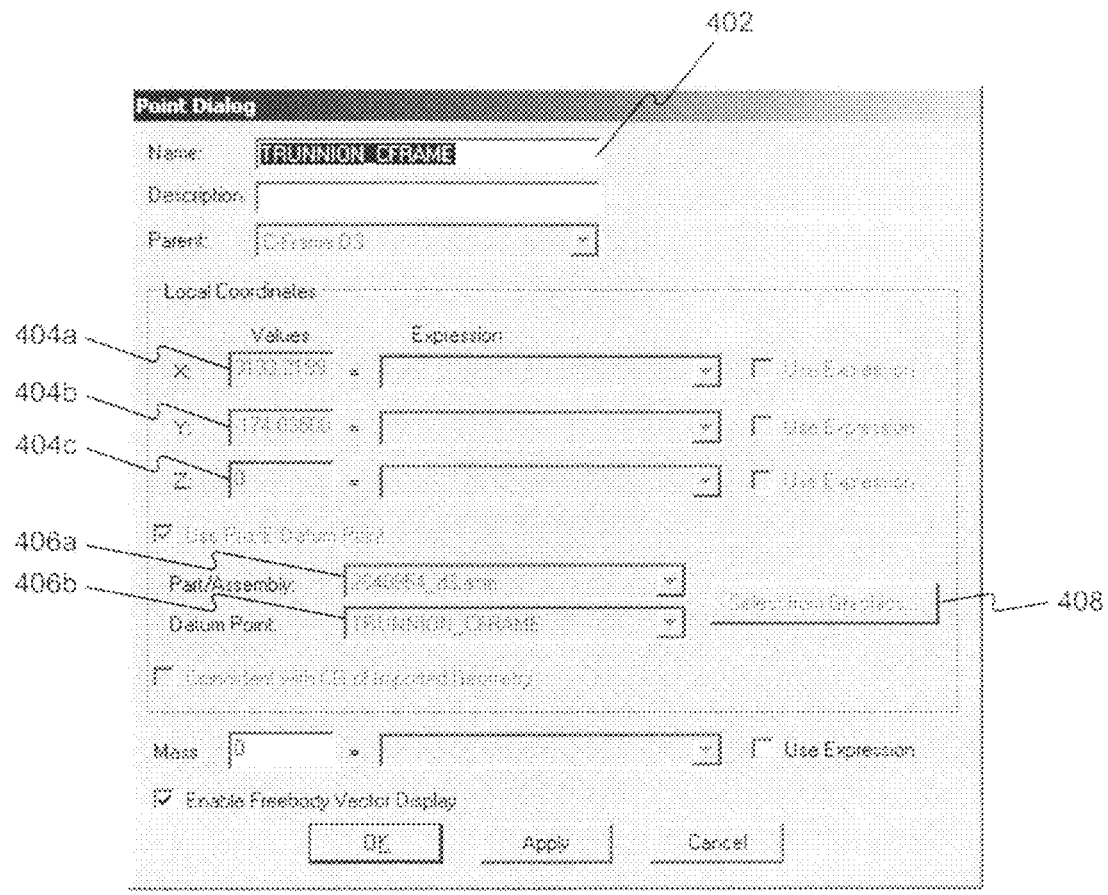
FIG. 4 illustrates a fourth exemplary GUI consistent with certain disclosed embodiments.

For example, a display such as depicted in FIG. 3 may include points included in the imported file (e.g., the points listed in white, such as "PNT0," "PNT1," "LIFT_ROD_RH," "LIFT_ROD_LH," "ANGLE_HEAD_RH," "ANGLE_HEAD_LH," "TRUNNION_CFRAME," etc.). Using a dialog box (e.g., depicted in FIG. 4) or other selection mechanism, a user may select one or more of those points to include in the analysis. For example, the user may enter the name of the point in "Name" box 402. Alternatively, or additionally, the user may select points manually by entering coordinates, such as the X, Y, and Z coordinates using "values" boxes 404a, 404b, and 404c, as depicted, for example, in FIG. 4. Alternatively, or additionally, a user may select points by selecting a point on the graphical image (e.g., the image depicted in FIG. 3) using "Part/Assembly" box 406a and "Datum Point" box 406b and/or using "Select from Graphics" button 408. Points may be selected to be used as connection points, or for other analysis (e.g., force analysis, described further below).

Figure 5:
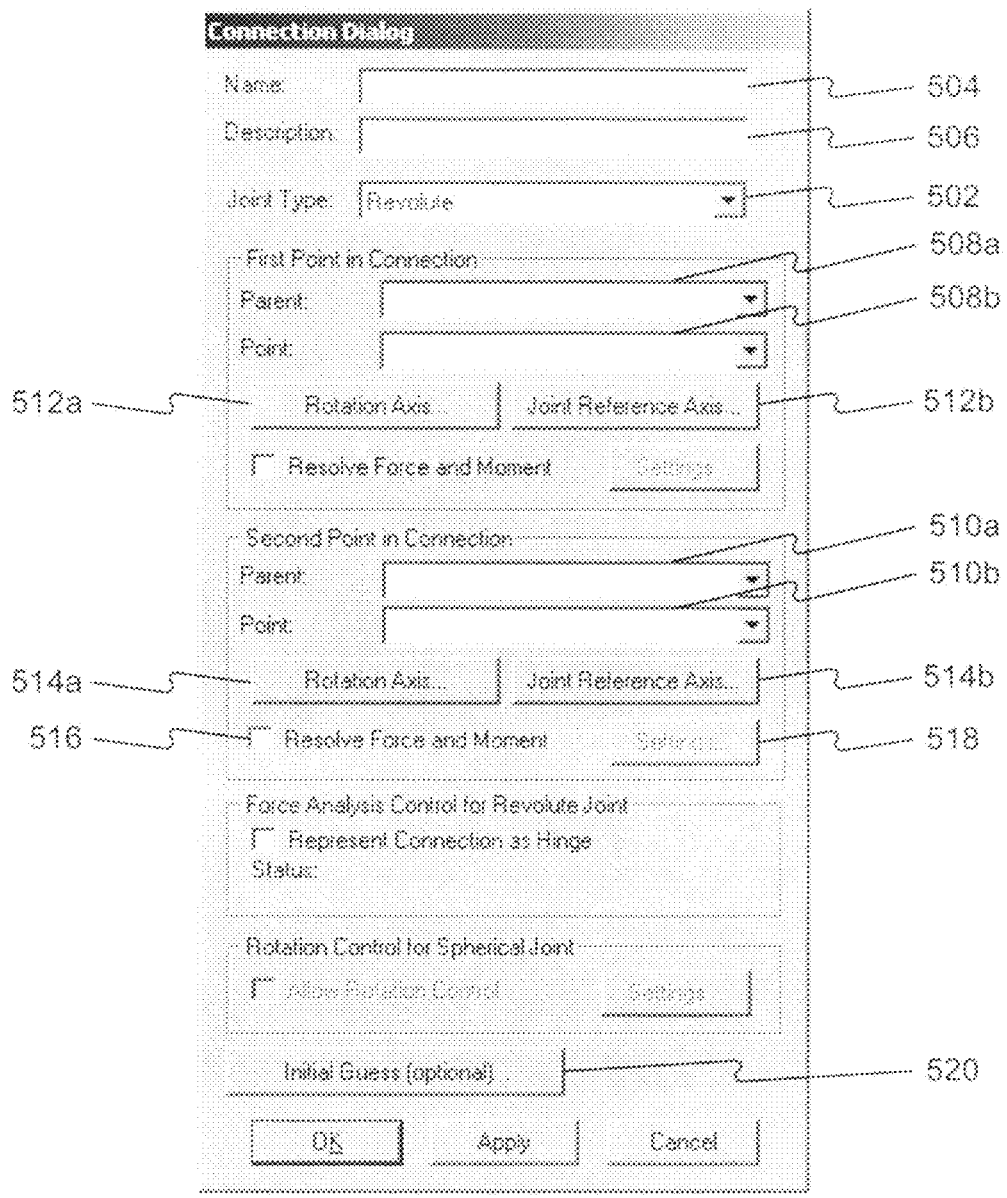
FIG. 5 illustrates a fifth exemplary GUI consistent with certain disclosed embodiments.

The user may additionally select one or more connections for connecting parts or sub-assemblies. For example, a dialog box such as depicted in FIG. 5 may be used to select a connection type (e.g., using "joint type" box 502), a connection name and description (e.g., using "Name" box 504 and "Description" box 506), a connection point on each part or sub-assembly (e.g., using "Parent" boxes 508a and 510a and "Point" boxes 508b and 510b), joint axis information (e.g., using "Rotation Axis" buttons 512a and 514a or "Joint Reference Axis" buttons 512b and 514b), etc. The connections may include two or three-dimensional joints, such as revolute joints, spherical joints, cylindrical joints, prismatic joints, etc. Additional selected physical attributes may also be included in the model.

Once the components, connections, points, and other physical attributes (e.g., specified physical dimensions) of a model are selected, a model may be created and analyzed. For example, in one embodiment, based on the selected components, connections, and points (which together comprise a "sublinkage"), the analysis package may determine all possible solutions that include the selected components, connections, and points. In one embodiment, the analysis package has a number of predefined sublinkages which correspond to predefined configurations of particular components, connections, and points. If the selected components, connections, and points correspond to a predefined sublinkage, the analysis package may determine all possible solutions to the sublinkage within the specified dimensions. The determined solutions may then be presented to a user for selection. This analysis may be implemented using class-based programming wherein each sublinkage is part of a class derived from a base class for all sublinkages. Because the sublinkages in this embodiment are predefined, the solutions may be determined without a computer program making any initial guesses of component, connection, or point values (e.g., component size, connection type or angle, point location, etc.). Both two-dimensional and three-dimensional sublinkages may be modeled using this system. For example, Exhibit 3 describes a number of two and three-dimensional sublinkages that may be stored as predefined sublinkages and selected as solutions, and further describes their properties. These include, for example: 2D sublinkages such as planar 2-body loop, planar 2-body loop with sliding joint, planar type a 4-body loop, planar type b 4-body loop, planar type c 4-body loop, planar type a 6-body loop, and planar 3-body loop with co-redundant cylinders; redundant sublinkages such as planar R-R redundant cylinder, R-S redundant cylinder, S-S redundant cylinder, RR-S redundant cylinder, and RR-RR redundant cylinder; and 3D sublinkages such as spatial 2-body loop, spatial 2-body loop with sliding joint, spherical 2-body loop, R-R chain with two S-S links, R joint with 2 co-redundant S-S cylinders, R joint with RR-S chain, R joint with 2 co-redundant RR-S cylinders, S joint with 3 S-S links, S joint with 2 S-S links and 2 co-redundant S-S cylinders, S joint with 2 RR-S chains and 1 S-S chain, spherical 4-body loop with 2 S-S links, L-shaped push arm with RR-S chain, L-shaped push arm with 2 co-redundant RR-S cylinders, taglink with S-S chain, taglink with 2 co-redundant S-S cylinders, taglink with RR-S chain, taglink with 2 co-redundant RR-S cylinders, taglink with RR-RR cylinder, and taglink with 2 co-redundant RR-RR cylinders.

Figure 7:
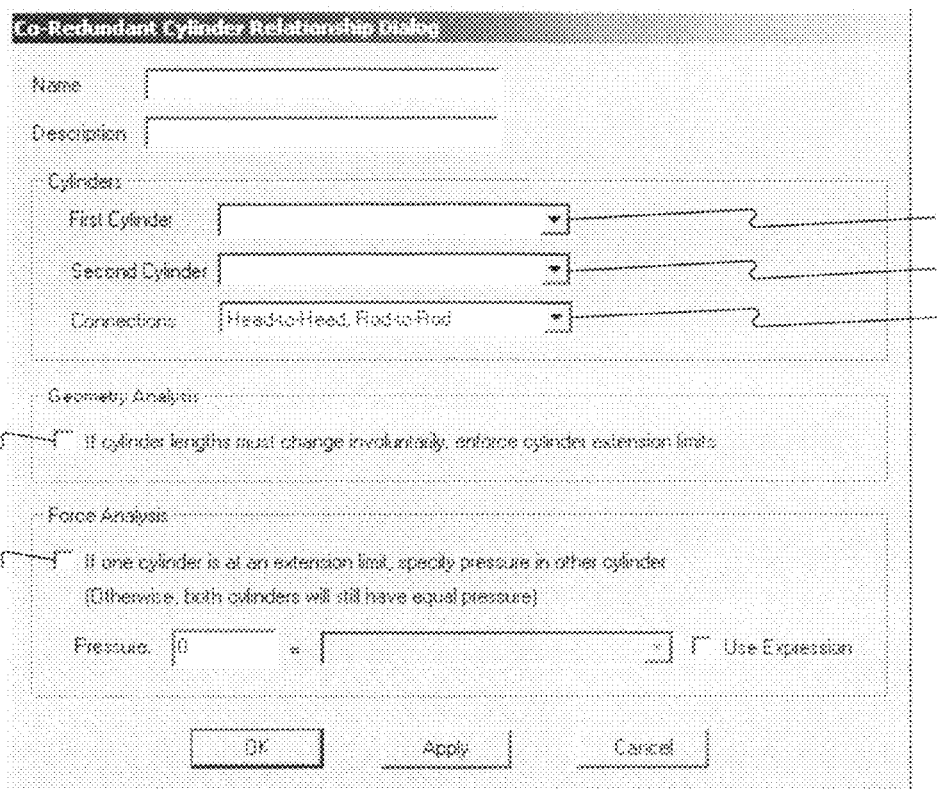
FIG. 7 illustrates a seventh exemplary GUI consistent with certain disclosed embodiments.

For example, in one embodiment where a co-redundant cylinder relationship is modeled (e.g., two cylinders are hydraulically connected), a dialog box such as shown in FIG. 7 may be used. For example, a user may select two cylinders to model using "First Cylinder" box 702 and "Second Cylinder" box 704, and "Connections" box 706 may be used to designate how the co-redundant cylinders are connected together (e.g., "head-to-head, rod-to-rod" or "head-to-rod, rod-to-head"). In one embodiment, when a co-redundant cylinder sublinkage is first detected and assembled, the length of the first cylinder is kept constant, and the second cylinder's length may vary to result in different possible solutions to the sublinkage. If the geometry of the sublinkage is later altered (e.g. edited or manipulated) such that one of the cylinders changes length, then the other cylinder length may change as well in order to allow for the new sublinkage position. In another embodiment, if the geometry is altered and the sublinkage moves in such as way that both cylinders cannot maintain their current lengths, then the analysis package may change the length of the two co-redundant cylinders so that the total fluid volume in the two cylinders is minimized. To prevent certain length changes, however, a user may select a box that sets limits on length changes (e.g., by selecting box 708 labeled "If cylinder must change involuntarily, enforce cylinder extension limits").

In certain embodiments, the analysis package may automatically reduce the number of possible solutions to present to the user. In this embodiment, a user may select additional attributes to further reduce the number of solutions before the analysis package presents the user with a graphical representation of the solutions. For example, a user may specify one or more values as constraints using a GUI (e.g., a constraint dialog box that permits entry of limits for variables such as component length, extension distance, rotation angle, etc.). If a given solution violates a constraint, then that solution will not be presented to the user. Constraints can be activated or deactivated using the GUI.

Figure 6:
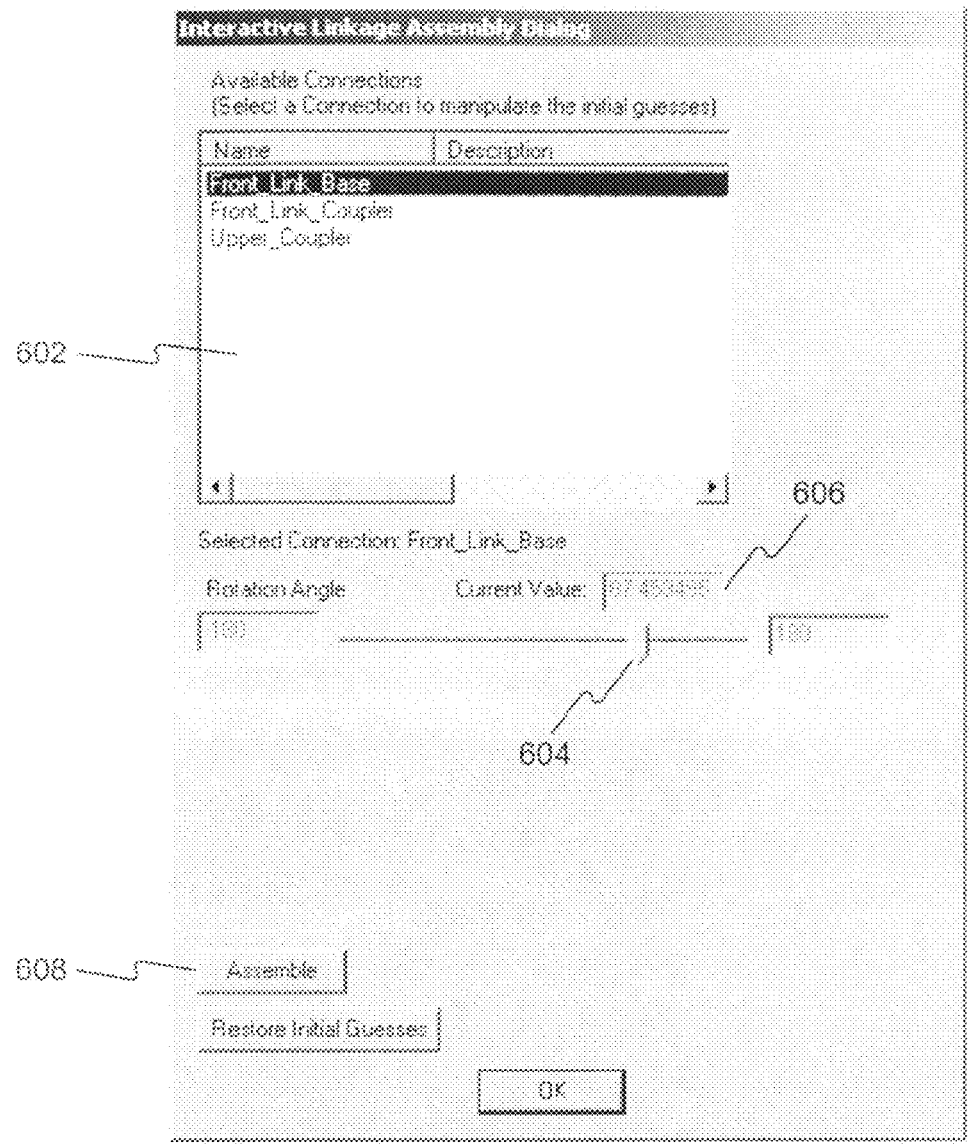
FIG. 6 illustrates a sixth exemplary GUI consistent with certain disclosed embodiments.
Figure 8:
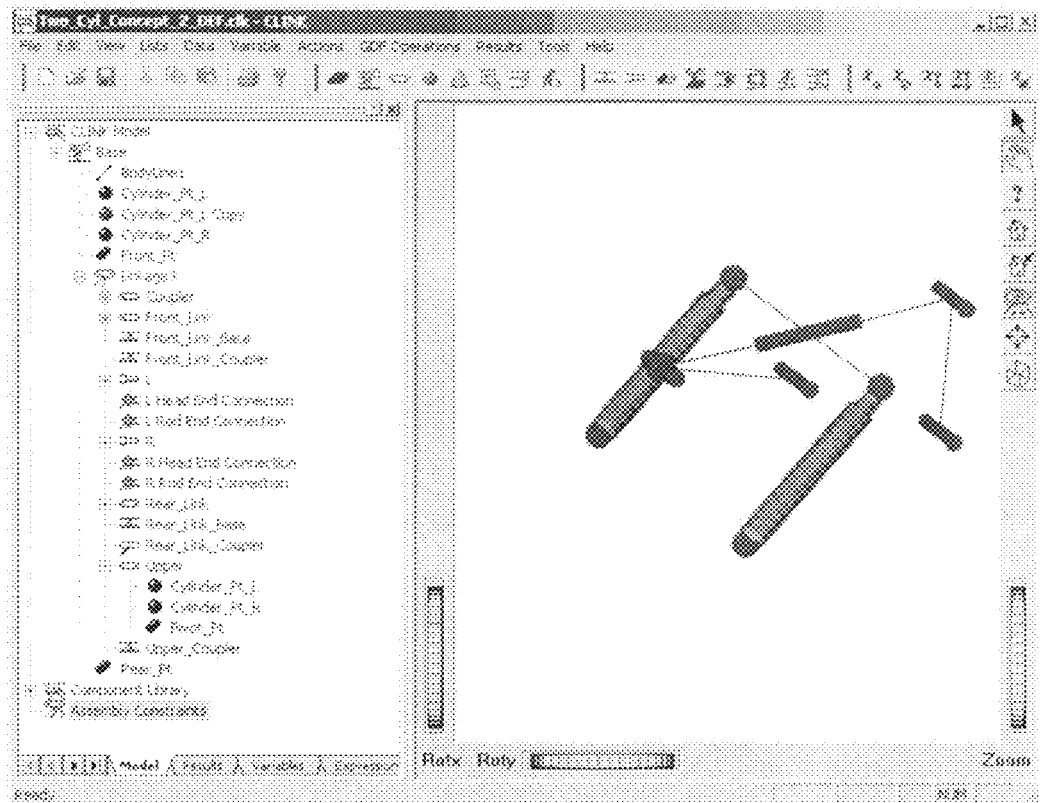
FIG. 8 illustrates an exemplary display and eighth exemplary GUI consistent with certain disclosed embodiments.

In certain embodiments, a user may select components, connections, and other linkage attributes for which the combined linkage attributes do not match with any predefined sublinkages. In this case, a number of sublinkages which are not predefined and which the user may want to define may be created. These non-predefined sublinkages are referred to as generalized sublinkages. To determine generalized sublinkages for a given set of data, the analysis package provides initial guesses for certain variables (e.g., component size, connection type, rotation angle, point location, etc.) to provide a starting point for iterations which eventually converge on a solution. An example of a generalized sublinkage is depicted in FIG. 8, which depicts a generalized sublinkage having certain rods, points, and connections. A user may select any point in FIG. 8, which brings up a GUI such as depicted in FIG. 6. To create a generalized sublinkage solution, the user may select one or more of the listed connections in window 602 of GUI (e.g., "Front_Link_Base," "Front_Link_Coupler," or "Upper_Coupler"), and may enter desired data for the connections (e.g., rotation angle, etc.) using selection bar 604, by entering a value into box 606, or via another selection mechanism. The user may then select "Assemble" button 608, which instructs the analysis package to converge on a solution for the generalized sublinkage. In one embodiment, the analysis package may develop a solution based on a smaller number of connections than are included in the sublinkage. For example, the sublinkage depicted in FIG. 8 includes nine connection points, but as shown in FIG. 6, only three of those are used to develop a generalized sublinkage solution. Because the number of variables from which to determine the generalized sublinkages is reduced, the number of iterations necessary to determine the group of possible solutions is reduced as well.

In one embodiment, the analysis package may determine the possible solutions to a sublinkage based on the sublinkage properties, and based on one or more algorithms. The possible solutions may then be presented via a GUI to a user, and the user may then select a desired solution. In one embodiment, once a user selects a desired solution, the user may elect to alter the physical attributes of one or more parts and/or connections of the model. In one embodiment, an algorithm is employed that preserves relationships between parts of a sublinkage, ensuring that the selected solution does not change despite the changes to the physical attributes. For example, although a user may change the length of a cylinder, the user-selected solution will remain the same.

In another embodiment, the analysis package permits analysis of different forces on the created model. For example, the analysis package may permit a user to designate a specific force to act on a point or other portion of the mechanical system (e.g., by entering a load of a selected magnitude and direction at one or more selected load points). Based on the force, the model configuration, one or more force variables, and one or more mathematical equations, the analysis package may then predict the reactive force on a point or other portion of the modeled system (e.g., cylinder pressure in a cylinder, forces at one or more connection points, cross-section forces and stresses, contact stresses at wear pads, etc.). In another embodiment, a user may enter a force limit for a particular portion of the model (e.g., pressure limit in a cylinder, rigid force limit at a point, contact stress limit, cross-section stress limit, machine tipping limit or sliding limit, etc.), and based on the limit, the model configuration, one or more force variables, and one or more mathematical equations, the analysis package may determine a maximum force that may be applied at different points or portions of the model so as to not exceed the limit.

Figure 9:
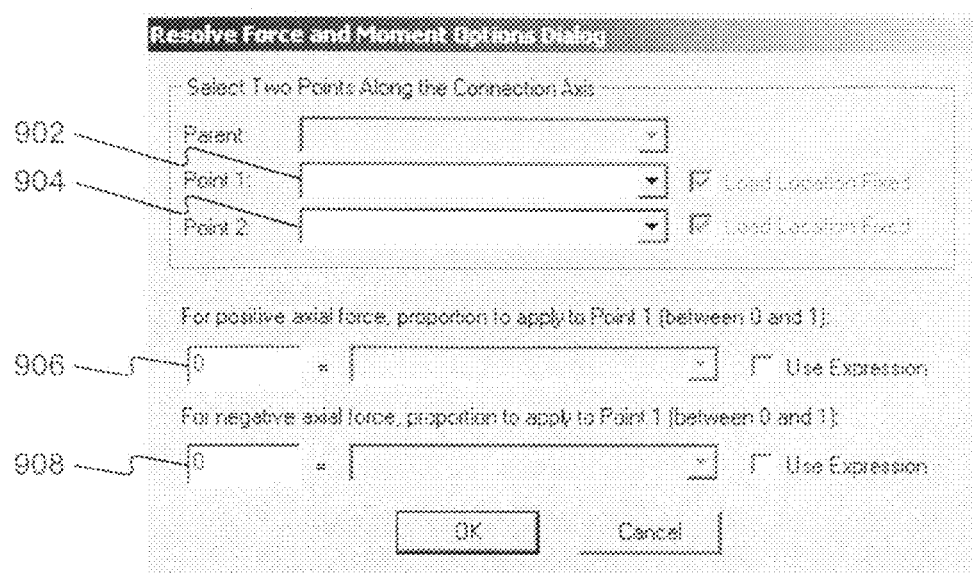
FIG. 9 illustrates a ninth exemplary GUI consistent with certain disclosed embodiments.

For revolute, cylindrical, and prismatic joints, for example, a reaction force and moment may be initially concentrated at the connection point. However, a user may select to resolve the force to two points that are on the connection axis. The user may select to resolve the force and moment by, for example selecting "Resolve Force and Moment" box 516 and selecting "Settings" button 518 in the dialog box shown in FIG. 5. As a result of the selection, a dialog box such as depicted in FIG. 9 may be displayed. In one embodiment, the user may designate two points on the connection axis using "Point 1" box 902 and "Point 2" box 904. The analysis package will then calculate reaction forces at those points that are equivalent to the reaction force and moment on the connection point. In one embodiment, the user may designate a proportion of axial force to assign to each of the two points, by entering values into, for example, box 906 and box 908.

The analysis package may perform analysis of force in co-redundant cylinders as well. For example, when analyzing force occurring in co-redundant cylinders, the analysis package may set equal pressures in the two cylinders according to how the cylinders are connected together. However, if one of the cylinders reaches its extension limit, the equal pressure condition may no longer be possible because the force on the cylinder at its extension limit is no longer proportional to the pressure in the cylinder. In this situation, a user may select a button that permits the user to specify the pressure in one of the cylinders (e.g., by selecting box 710 in FIG. 7, labeled "In one cylinder is at an extension limit, specify pressure in the other cylinder").

INDUSTRIAL APPLICABILITY

The features of the disclosed embodiments may be used to model any system that includes mechanical components. For example, in one embodiment, the analysis package may be used to model and analyze one or more components of machines such as tractors, motor graders, or other similar machines. Furthermore, the analysis package may be used for a number of purposes, such as testing existing machine designs, or creating new designs.

Additional aspects of the disclosed embodiments are provided in the Exhibits which were attached to Provisional U.S. Patent Application No. 60/880,710, from which this Application claims priority. The contents of these exhibits are incorporated herein in their entirety. Exhibit 1 provides a general description of the disclosed method, system, and computer program product; Exhibit 2 provides figures associated with Exhibit 1; Exhibit 3 provides a further description of specific sublinkages associated with the disclosed method, system, and computer program product; and Exhibit 4 provides a further description of the disclosed method, system, and computer program product.

It will be apparent to those skilled in the art that various modifications and variations can be made to the method and system for analyzing three-dimensional linkages disclosed herein. Other embodiments will be apparent to those skilled in the art from consideration of the specification and practice of the disclosed system and method. For example, although the disclosed embodiments include exemplary GUIs, it should be noted that any type of GUI may be used to model, analyze, process, and display the data disclosed herein. It is intended that the specification and examples be considered as exemplary only, with a true scope being indicated by the following claims and their equivalents.

What is claimed is:

1. A computer-implemented method for analyzing a mechanical system, the method comprising:
   using a computer program product executed by a processor associated with the computer, importing from an engineering design software program data related to a mechanical assembly;
   using the computer program product, receiving a selection of one or more sub-assemblies of the mechanical assembly;
   receiving user input comprising a selection of two or more points associated with the one or more sub-assemblies, and of one or more connections of the points, to form a user-defined sublinkage;
   accessing a library of a plurality of predefined sublinkages corresponding to predefined configurations of particular linkages and connection points between the linkages;
   matching, automatically by at least one computer processor, the user-defined sublinkage to a predefined sublinkage contained in the library of the plurality of predefined sublinkages;
   determining, by the at least one processor and based on the matching predefined sublinkage, a plurality of three-dimensional model solutions of the user-defined sublinkage, wherein each of the determined plurality of model solutions of the user-defined sublinkage includes the same linkages and connection points between the linkages but different positions and orientations of the linkages;
   presenting the three-dimensional model solutions to a user; and
   receiving a selection of a model solution from the presented three-dimensional model solutions.

2. The method of claim 1, further including:
   receiving a selection of the two or more points by one or more of: selecting point data displayed on a display of the mechanical assembly, and selecting at least one of the two or more points by entering coordinates.

3. The method of claim 1, further including:
   altering physical attributes of one or more portions of the selected model solution; and
   preserving a physical relationship between the altered physical attribute and other physical attributes of the selected model solution.

4. The method of claim 1, further including:
   analyzing the selected model solution by designating a force to act on a portion of the selected model; and
   predicting, based on the designated force, the configuration of the selected model solution, and one or more mathematical equations, a reactive force on another portion of the selected model solution.

5. The method of claim 1, wherein:
   the determining of the one or more three-dimensional model solutions includes the computer program product selecting a set of possible solutions without the computer program product making any initial guesses of component, connection, or point values.

6. The method of claim 1, wherein the one or more three-dimensional model solutions are not predefined solutions, and wherein:
   the determining of the one or more three-dimensional model solutions includes providing an initial guess of a component value by the computer program product.

7. The method of claim 1, further including:
   using the computer program product, selecting one or more constraint values; and
   reducing the number of presented three-dimensional model solutions based on the selected one or more constraint values.

8. A non-transitory computer-readable storage medium storing a computer program product, the computer program product including instructions, the instructions when executed, instructing one or more processors to perform a method, the method comprising:
   importing, from an engineering design software program, data related to a mechanical assembly;
   receiving a selection of one or more sub-assemblies of the mechanical assembly;
   receiving user input comprising a selection of two or more points associated with the sub-assemblies, and of one or more connections of the points, to form a user-defined sublinkage;
   accessing a library of a plurality of predefined sublinkages corresponding to predefined configurations of particular linkages and connection points between the linkages;
   automatically matching the user-defined sublinkage to a predefined sublinkage contained in the library of the plurality of predefined sublinkages;
   based on a determination that the user-defined sublinkage matches a predefined sublinkage:
      solving for a plurality of three-dimensional model solutions to the user-defined sublinkage based on the matching predefined sublinkage, wherein each of the solved plurality of model solutions includes the same linkages and connection points between the linkages but different positions and orientations of the linkages;
      presenting the solved three-dimensional model solutions to a user; and
      receiving a selection of a model solution from the presented three-dimensional model solutions; and
   based on a determination that the user defined sublinkage does not match a predefined:
      presenting a generalized sublinkage, the generalized sublinkage having initial selected points and connections between the initial selected points;
      receiving, via a graphical user interface (GUI), a selection of an initial connection of the generalized sublinkage;
      receiving, via the GUI, input of properties of the selected initial connection of the generalized sublinkage;
      determining a plurality of three-dimensional model solutions to the generalized sublinkage based on the initial selected points and connections between the selected points and on the input properties of the selected initial connection of the generalized sublinkage;

presenting, via the GUI, the determined three-dimensional model solutions to the generalized sublinkage; and receiving, via the GUI, a selection by the user of one of the determined three-dimensional model solutions to the generalized sublinkage.

9. The computer-readable storage medium of claim 8, the method further including:

receiving the selection of the two or more points by one or more of: receiving point data selected from a display of the mechanical assembly, and receiving selected coordinates of at least one of the two or more points.

10. The computer-readable storage medium of claim 6, the method further including:

permitting a user to alter physical attributes of one or more portions of the selected model solution of the user-defined sublinkage; and preserving a physical relationship between the altered physical attribute and other physical attributes of the selected model solution the user-defined sublinkage.

11. The computer-readable storage medium of claim 8, the method further including:

receiving an indication of designated force acting on a portion of the selected model solution; and predicting, based on the designated force, the configuration of the selected model solution, and one or more mathematical equations, a reactive force on another portion of the selected model solution.

12. The computer-readable storage medium of claim 8, wherein determining the one or more three-dimensional model solutions includes:

selecting a set of possible solutions without making any initial guesses of component, connection, or point values.

13. A computer-implemented method for creating a model of a three-dimensional mechanical assembly, the method comprising:

selecting, based on input by a user to the computer, one or more sub-assemblies of the mechanical assembly selecting, based on input by the user, two or more points of the one or more sub-assemblies, and of one or more connections of the points, to form a user-defined sublinkage;

accessing library of a plurality of predefined sublinkages corresponding to predefined configurations of particular linkages and connection points between the linkages;

matching the user-defined sublinkage to a predefined sublinkage contained in the library of the plurality of predefined sublinkages;

determining a plurality of three-dimensional model solutions to the user-defined sublinkage based on the predefined sublinkage, wherein each of the determined plurality of solutions includes the same linkages and connection points between the linkages but different positions and orientations of the linkages;

presenting the three-dimensional model solutions of the user-defined sublinkage via the GUI; and receiving, via the GUI, selection of a presented model solution from the presented three-dimensional model solutions of the user-defined sublinkage.

14. The method of claim 13, further including:

selecting the two or more points by one or more of: selecting point data displayed on a display of the mechanical assembly, and selecting at least one of the two or more points by entering coordinates.

15. The method of claim 13, further including:

altering, by the user, physical attributes of one or more portions of the selected model solution; and preserving a physical relationship between the altered physical attribute and other physical attributes of the selected model solution.

16. The method of claim 13, further including:

designating, by the user, a force to act on a portion of the selected model solution; and predicting, based on the designated force, the configuration of the selected model solution, and one or more mathematical equations, a reactive force on another portion of the selected model.

17. The method of claim 13, wherein determining by the computer program product the one or more three-dimensional model solutions includes:

the computer program product selecting a set of possible solutions without the computer program product making any initial guesses of component, connection, or point values.

* * * * *

UNITED STATES PATENT AND TRADEMARK OFFICE
CERTIFICATE OF CORRECTION

| | | |
|---|---|---|
| PATENT NO. | : 8,504,337 B2 | Page 1 of 1 |
| APPLICATION NO. | : 12/007964 | |
| DATED | : August 6, 2013 | |
| INVENTOR(S) | : Foster et al. | |

It is certified that error appears in the above-identified patent and that said Letters Patent is hereby corrected as shown below:

In the Specification

Column 2, line 23, delete "embodiments;" and insert -- embodiments; and --.

Column 3, lines 36-38, delete "data indicating high-stress points, etc.) imported from the Pro/E file.

For example, a display such as depicted in FIG. 3" and insert -- data indicating high-stress points, etc.) imported from the Pro/E file. For example, a display such as depicted in FIG. 3 --.

In the Claims

Column 8, line 56, in Claim 8, delete "match a predefined:" and insert -- match a predefined sublinkage: --.

Column 9, line 23, in Claim 10, delete "solution the" and insert -- solution of the --.

Column 9, lines 42-43, in Claim 13, delete "assembly selecting," and insert -- assembly; selecting, --.

Signed and Sealed this
Twenty-fifth Day of August, 2015

Michelle K. Lee
*Director of the United States Patent and Trademark Office*